United States Patent [19]

Keil et al.

[11] 4,012,243
[45] Mar. 15, 1977

[54] METHOD OF FABRICATING MULTICOLOR LIGHT DISPLAYS UTILIZING ETCH AND REFILL TECHNIQUES

[75] Inventors: John G. Keil, Scottsdale; Michael G. Coleman, Tempe, both of Ariz.

[73] Assignee: Motorola, Inc., Chicago, Ill.

[22] Filed: Sept. 19, 1973

[21] Appl. No.: 398,747

Related U.S. Application Data

[63] Continuation of Ser. No. 198,221, Nov. 12, 1971, abandoned.

[52] U.S. Cl. .............................. 148/175; 29/577; 29/578; 29/580; 148/187; 250/211 J; 307/311; 313/500; 357/17; 357/45; 357/46

[51] Int. Cl.² .................. H01L 21/20; H01L 21/82; H01L 29/207

[58] Field of Search ............ 148/175, 187; 357/17, 357/45, 46; 29/577, 578, 580; 250/211 J; 313/500; 307/311

[56] References Cited

UNITED STATES PATENTS

| | | | |
|---|---|---|---|
| 3,316,128 | 4/1967 | Osafune et al. | 148/175 X |
| 3,333,135 | 7/1967 | Galginaitis | 357/17 X |
| 3,404,305 | 10/1968 | Wright | 357/17 X |
| 3,433,686 | 3/1969 | Marinace | 148/175 |
| 3,579,055 | 5/1971 | Ross | 148/175 X |
| 3,611,069 | 10/1971 | Galginaitis et al. | 148/175 X |
| 3,727,115 | 4/1973 | Shang | 148/175 X |
| 3,850,707 | 11/1974 | Bestland | 148/175 X |
| 3,905,037 | 9/1975 | Bean et al. | 357/17 X |
| 3,914,137 | 10/1975 | Huffman et al. | 148/175 |

OTHER PUBLICATIONS

STERN et al., "FABRICATION OF PLANAR ARRAYS . . . BARRIERS" I.B.M. TECH DISCL. BULL. vol. 7, No. 11, APR. 1965, p. 1103.

AGUSTA et al., "MONOLITHIC INTEGRATED . . . REGIONS" IBID, vol. 9, No. 5, Oct. 1966, pp. 546-547.

MURRAY et al., "LIGHTING UP IN A GROUP" ELECTRONICS, MAR. 4, 1968, pp. 104-110.

*Primary Examiner*—C. Lovell
*Assistant Examiner*—W. G. Saba
*Attorney, Agent, or Firm*—Henry T. Olsen

[57] ABSTRACT

There is disclosed a method of manufacturing a multicolor monolithic light display utilizing the etching of multiple channels in a substrate and selectively refilling said channels with single crystal material, each channel being filled with material capable of emitting light of a given wavelength, depending on the dopant or the type of material deposited. There is also disclosed a multicolor or monolithic light display comprising at least a pair of matrices of light emitting diodes in an integral structure which pair of matrices are alternatively or simultaneously, scannable to produce a display in a first and a second color. Each matrix includes a plurality of light emitting diodes, preferably gallium phosphide, which, by proper doping, can be made to emit either a red or a green wavelength of light. The light emitting diodes are arranged in the geometric pattern of columns and rows with the first matrix interspersed with the second matrix so that an alpha numeric character produced by one matrix will appear at almost the same physical location as a character of the alternate color. Row and column address lines are provided for each matrix so that a strobing format logic address system can effect lighting of the individual diodes for producing an alpha numeric character or graphic display in either one color or the other, or both.

3 Claims, 12 Drawing Figures

4,012,243

METHOD OF FABRICATING MULTICOLOR LIGHT DISPLAYS UTILIZING ETCH AND REFILL TECHNIQUES

This is a continuation, application Ser. No. 198,221 filed Nov. 12, 1971, now abandoned.

BACKGROUND OF THE INVENTION

This invention relates to alpha numeric displays and more particularly to a multicolor alpha numeric display. Still more particularly, the invention is related to a multicolor monolithic light emitting diode display which is scannably addressable to produce characters in alternative or simultaneous colors.

Visual readout devices such as alpha numeric displays are utilized for many purposes such as computer readouts, process control instrumentation, aircraft and automotive instrument panels, and various other indicators such as clocks and gauges. In many of these uses, it would be desirable if the display could operate in a differential color mode so as to provide an additional indicator of the meaning of the information. For example, a direct reading altimeter for an aircraft might be programmed so that altitudes below a certain height might appear in a distinctive color to further warn the pilot of the position of the aircraft. Also, since the multicolor display basically can occupy the same panel space as a single color display, two distinct types of information may be displayed in the same panel space by the use of one color to indicate one type of information, and another color to indicate still another type of information. Thus, in accordance with the invention, a multicolor display can occupy less space and provide additional functions not presently available from standard display devices.

SUMMARY OF THE INVENTION

It is a primary object of this invention to provide a multicolor display device.

A further object of the invention is to provide a multicolor monolithic light emitting diode display device which can serve a variety of purposes while being compact and easily utilized.

A still further object of the invention is to provide a method of manufacturing the aforementioned monolithic light emitting diode display device.

In accordance with the aforementioned objects, there is provided a multicolor light display comprising a first matrix of light emitting diodes in an integral structure, said light emitting diodes being arranged in columns and rows. A second matrix of light emitting diodes in said integral structure, said second matrix being arranged in columns and rows interspersed between the columns and rows of said first matrix. Preferably said light emitting diodes are of the same basic material, gallium phosphide, which can be conveniently and economically produced in a single semiconductor substrate by suitable processing herein disclosed.

THE DRAWINGS

Further objects and advantages of the invention will be obvious to one skilled in the art from the following complete description thereof and from the drawings wherein.

DETAILED DESCRIPTION

While the preferred embodiment of the invention is disclosed with particular reference to a monolithic array of gallium phosphide light emitting diodes, it will be appreciated that any appropriate light emitting diode material such as gallium arsenide or gallium arsenide phosphide or combinations thereof, may be used. The carrier substrate for the array may be of any suitable material sufficiently matching the crystal structure of the gallium phosphide to permit monocrystalline epitaxial growth thereon. However, from a compatibility standpoint, the multicolor array can be made from the single material, gallium phosphide.

Figure 1:
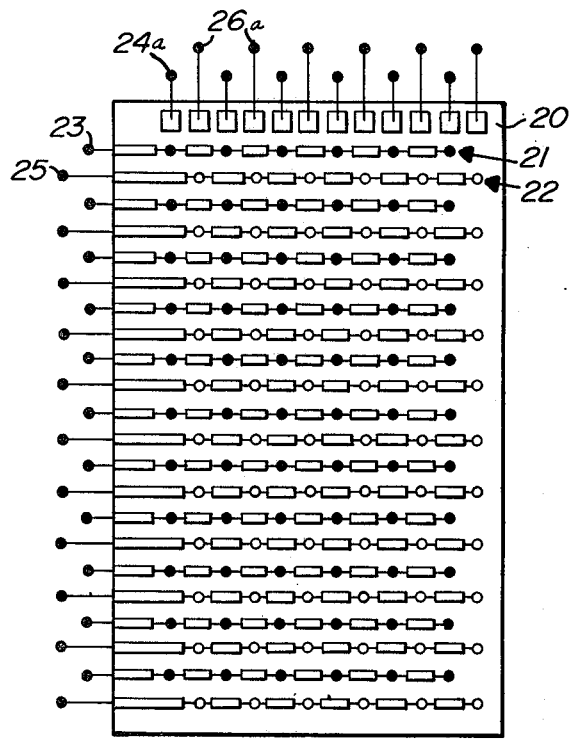
FIG. 1 is a plan view of a multicolor monolithic light emitting diode display device in accordance with the preferred embodiment of the invention depicted herein somewhat schematically.
Figure 3:
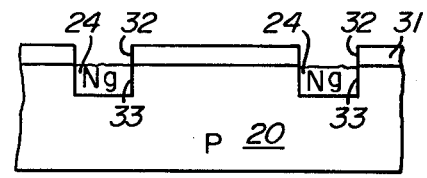
FIGS. 3–7 are partial cross sections depicting schematically in enlarged scale successive stages in the manufacture of the light emitting diode array.
Figure 4:
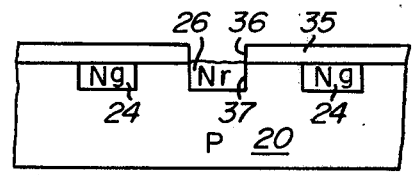
Figure 5:
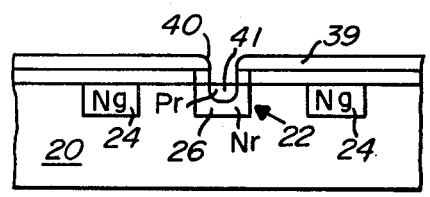

In accordance with the preferred embodiment of the invention as shown in FIG. 1, the multicolor light emitting diode array comprises a monolithic semiconductor support structure 20 containing a first plurality of green light emitting diodes 21 and a second plurality of red light emitting diodes 22 in a pair of geometric matrices of rows and columns. The green light emitting diodes 21 are addressed by row address lines 23 and column address lines 24a. The red light emitting diodes 22 are addressed by row address lines 25 and column address lines 26a. As shown, each matrix has a row of six diodes and a column containing eleven diodes, making a total of 66 light emitting diodes in each matrix. Through the address lines 23, 24a, 25 and 26a, a suitable strobing or scanning type logic can individually address any of the light emitting diodes to cause each to emit light in a suitable alpha numeric pattern in either or both colors.

Figure 2:
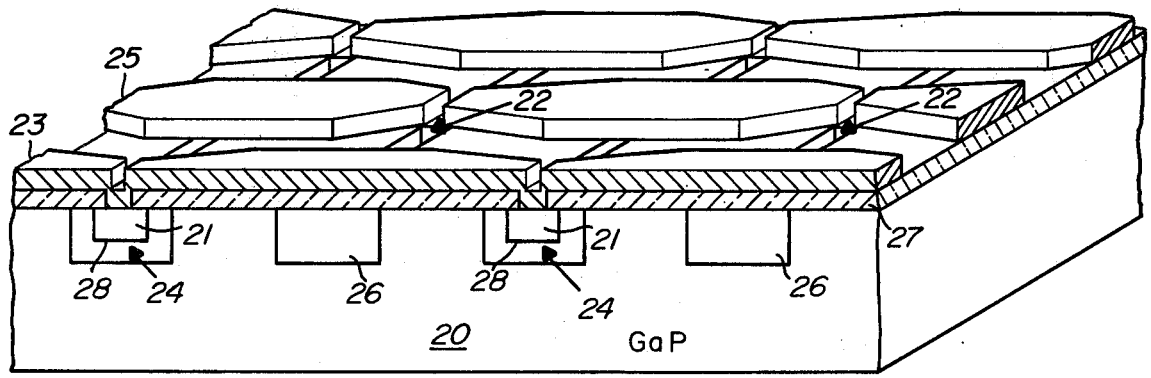
FIG. 2 is an isometric view of a portion of the device of FIG. 1 in partial cross section.
Figure 6:
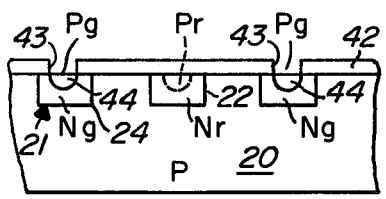

The display is shown in greater detail on FIG. 2 and as shown, comprises the supporting substrate 20 containing alternated semiconductor material columns 24 and 26 integral therewith. In spaced locations within the columns 24 and 26 are formed PN junctions forming the light emitting diodes 21 and 22. An insulating layer 27 overlies the entire surface of the structure and the row address lines 23 and 25 contract the individual light emitting diodes 21 or 22 through windows therein. Thus, it will be seen that the front row line 23 contacts the light emitting diodes 21 through an opening in the layer of dielectric and the second row of metallization 25 contacts the diodes 22 while both row lines are insulated from the column lines 24 and 26 by the dielectric layer 27. The original starting substrate in accordance with the preferred embodiment is of P-conductivity type gallium phosphide and the columns 24 and 26 are of N-type conductivity gallium phosphide, epitaxially deposited to form the interleaved channels. P-conductivity diffusions or epitaxially depositions placed in the columns 24 and 26 define the PN junctions of the light emitting diodes 21 and 22 respectively. Thus, the interleaved columns of the display are actually common cathodes of each one of the light emitting diodes which are electrically isolated from all other columns by junction isolation with the P-conductivity gallium phosphide substrate. To obtain red light emitting diodes with gallium phosphide material, the N-conductivity material is obtained by doping with tellurium or selenium or sulfur and the P epitaxy is doped with zinc and oxygen. The green emitting light emitting diodes use nitrogen plus either tellurium, sulfur or selenium to obtain the N-conductivity region and P-conductivity in gallium phosphide is obtained with zinc or cadmium doping.

The array may be produced by a combination of photolithographic and epitaxial techniques as is schematically depicted in FIGS. 3–7. Beginning with a P-type gallium phosphide substrate 20, a masking layer 31 is deposited thereon. Windows 32 are opened in the masking layer utilizing a photo resist step and channels 33 then etched in the substrate. Columns 24 are then epitaxially grown in the channels, utilizing an N-conductivity green emission gallium phosphide material ($N_g$) and the masking layer 31 removed. Another masking layer 35 (FIG. 4) is deposited upon the substrate 20 and windows 36 opened therein. Channels 37 are then etched into the substrate and epitaxially filled with the column conductors 26 of N-conductivity red emission gallium phosphide ($N_r$).

Figure 7:
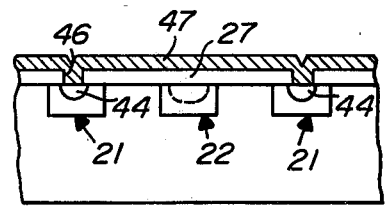
Figure 9:
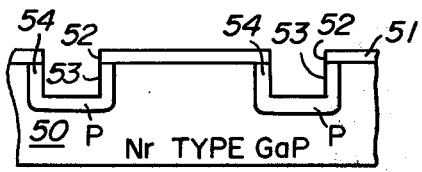
FIGS. 9–12 are cross sectional views depicting schematically in enlarged scale successive stages in the manufacture of the multicolor light emitting diode array in accordance with a further embodiment.
Figure 8:
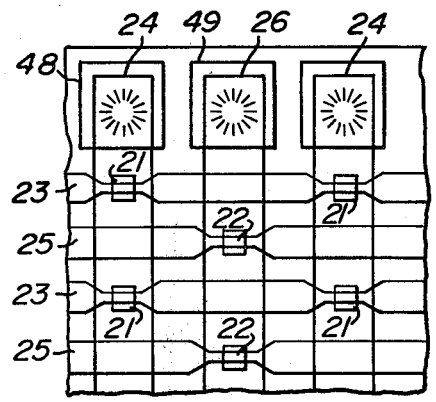
FIG. 8 is a top plan view of a portion of the array.

Another masking layer 39 (FIG. 5) is deposited on the substrate and windows 40 opened therein. A diffusion step then forms the P-conductivity for the red emitting diode ($P_r$) region 41 to define the plurality of red light emitting diodes 22, after which the masking layers 35 and 31 are removed. Another masking layer 42 (FIG. 6) is deposited on the substrate 20 and windows 43 are opened therein to expose selected areas of the column conductors 24. An etch and epitaxial deposition step is then utilized to produce the $P_g$ conductivity regions 44 to define the green light emitting diodes 21, following which the masking layer 42 is removed and the dielectric layer 27 deposited on the surface of the substrate 20. Utilizing standard photomask technique, windows 46 are opened over the P-diffusions and a layer of metallization deposited on the entire surface of the dielectric layer 27 and through the openings 46 contacting all of the anodes of all of the light emitting diodes 21 and 22 (FIG. 7). Following the metallization step, the metal layer 47 is etched into the respective row conductors 23 and 25 (FIG. 8) and also serves to form bonding paths 48 and 49 for the column conductors 24 and 26, windows 46 having been opened at the ends of the column conductors so that the metallization layer 47 contacted the ends of the columns. A separate metallization step may be utilized for contacts 47 to form ohmic contact with the columns.

Figure 10:
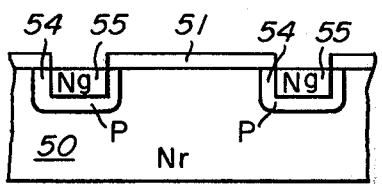
Figure 12:
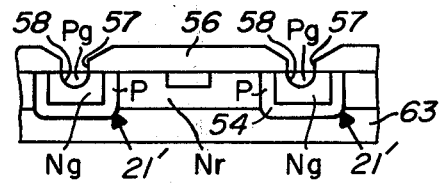
Figure 11:
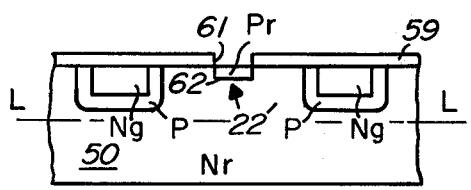

Successive stages in the manufacture of the multicolor light emitting display in accordance with another embodiment is set forth in FIGS. 9–12 which embodiment eliminates one of the epitaxial steps by beginning with an $N_r$ conductivity type gallium phosphide substrate 50. Following deposition of a masking layer 51, windows 52 are opened therein and deep channels or separate cavities 53 etched into the surface of the substrate. Following the formation of the cavities 53, a diffusion step is utilized to form a P-region 54 surrounding the channel which will form a junction isolation zone surrounding the channel. Then, an epitaxial filling 55 of $N_g$ conductivity gallium phosphide is deposited to fill the channels (FIG. 10). Another masking layer 59 is then deposited over the surface of the substrate and windows 61 opened in selected regions thereof intermediate columns 55 to define the position of the anodes of the red emitting diodes 22', an etch and epitaxial step being utilized providing a filling 62 (FIG. 11). The lower portion of the substrate 50 is removed by lapping to line L—L to almost expose the P-regions 54. Following placement of a masking layer 56 on the top surface of the remainder of the wafer (FIG. 12), windows 57 are opened to expose selected portions of channels 55. The entire wafer is then diffused with a P-dopant forming $P_g$ anodes 58 and an isolation diffusion 63 connecting with P-regions 54. Two types and layers of suitable parallel and crossing metallization will then serve to connect the red and green light emitting diodes to their row address and column address lines.

While the invention has been described by way of the preferred embodiment thereof, and with particular reference to a two color display system, it will be appreciated that the same principles of the invention could be utilized to provide a three color system, or even more. Also, while green light emitting gallium phosphide diodes emitting at a wavelength of near 0.56 microns and red gallium phosphide light emitting diodes emitting at a wavelength of near 0.70 microns are particularly disclosed, it will be appreciated that gallium arsenide phosphide diodes emitting at a wavelength of near 0.66 microns (red) could be also utilize, or any other suitable material emitting light in the visible range. Similarly, both sets of the multicolor matrix is visible while a layer of gallium arsenide emitting in the non visible infrared spectrum could be utilized for infrared detectors from the same panel unit. Also, while a specific size of matrix is disclosed, any number and pattern of diodes may be utilized. It is therefore to be appreciated that suitable further modifications can be made herein without departing from the spirit and scope of the invention.

What is claimed is:

1. A process for the manufacture of a multicolor monolithic light display comprising:
    a. etching a first set of channels in a monolithic substrate of one conductivity type;
    b. epitaxially filling said channels with a first monocrystalline material containing a first conductivity effecting material of opposite conductivity type;
    c. forming regions of said one conductivity type into selected portions of said channel;
    d. etching a second set of channels in the surface of said substrate;
    e. epitaxially filling said second channels with a second monocrystalline material containing a second conductivity effecting material of said opposite conductivity type;
    f. forming regions of said one conductivity type into selected portions of said second channel.

2. A process for the manufacture of a multicolor monolithic light display as recited in claim 1 and further including the steps of covering said substrate with a dielectric layer; opening windows therein to said one conductivity region, and placing layers of metallization thereover to contact all of the regions of said one conductivity type.

3. A process for the manufacture of a multicolor monolithic light display as recited in claim 2 and further including the step of etching said metallization layer into a plurality of row connectors.

* * * * *